United States Patent
Lampe et al.

(10) Patent No.: US 12,398,705 B2
(45) Date of Patent: Aug. 26, 2025

(54) CONTROL DEVICE AND PLASMA ENERGY PROTECTIVE APPARATUS FOR AN ION THRUSTER

(71) Applicant: Tesat-Spacecom GmbH & Co. KG, Backnang (DE)

(72) Inventors: Alexander Lampe, Backnang (DE); Jochen Artmann, Backnang (DE)

(73) Assignee: Tesat-Spacecom GmbH & Co. KG, Backnang (DE)

( * ) Notice: Subject to any disclaimer, the term of this patent is extended or adjusted under 35 U.S.C. 154(b) by 18 days.

(21) Appl. No.: 18/378,861

(22) Filed: Oct. 11, 2023

(65) Prior Publication Data

US 2024/0369048 A1   Nov. 7, 2024

(30) Foreign Application Priority Data

Oct. 12, 2022   (DE) .......................... 102022126571.4

(51) Int. Cl.
*F03H 1/00* (2006.01)
*G01R 23/00* (2006.01)

(52) U.S. Cl.
CPC .......... *F03H 1/0018* (2013.01); *F03H 1/0037* (2013.01); *G01R 23/00* (2013.01)

(58) Field of Classification Search
CPC ...... F03H 1/0056; F03H 1/005; F03H 1/0018; F03H 1/0037; B64G 1/405; B64G 1/411
See application file for complete search history.

(56) References Cited

U.S. PATENT DOCUMENTS

| | | | |
|---|---|---|---|
| 4,622,478 A | 11/1986 | Ise et al. | |
| 4,638,149 A * | 1/1987 | Wessel | G05F 3/04 323/361 |
| 8,024,917 B2 * | 9/2011 | Hruby | F03H 1/0018 60/202 |
| 10,823,157 B2 * | 11/2020 | John | H03L 7/085 |
| 2018/0283365 A1 | 10/2018 | John et al. | |
| 2020/0378372 A1 * | 12/2020 | Liang | F03H 1/0018 |

FOREIGN PATENT DOCUMENTS

DE   102017107177 A1   10/2018
EP       3386275 A1   10/2018

* cited by examiner

*Primary Examiner* — Andrew H Nguyen
(74) *Attorney, Agent, or Firm* — Lerner David LLP

(57) ABSTRACT

A control device for a frequency generator of an ion thruster is described. The control device permits the detection of zero-crossings in a current and/or voltage characteristic during specific time intervals only, which detection is inhibited during other time intervals. Any incorrect switching performance of the control device associated with erroneously detected zero-crossings is prevented accordingly. A low-pass filter filters harmonics out of the detected current and/or voltage characteristics. A time-delay element offsets stray delays in the detection of zero-crossings. Additionally, plasma energy protective apparatuses are described, which attenuate the impact of any power flashover from a thruster unit to a power supply unit of an ion thruster.

14 Claims, 5 Drawing Sheets

CONTROL DEVICE AND PLASMA ENERGY PROTECTIVE APPARATUS FOR AN ION THRUSTER

FIELD OF THE INVENTION

The present description relates to a control device for a frequency generator, in particular for a frequency generator for an ion thruster, and to an ion thruster. The ion thruster incorporates a control device of this type. In alternative configurations, the ion thruster contains one or more plasma energy protective apparatuses, which prevent or restrict any power flashover on the power supply components of the ion thruster.

BACKGROUND OF THE INVENTION

Ion thrusters are typically employed for the propulsion of spacecraft or satellites. An ion stream is generated, and drives the spacecraft by the recoil principle. The ion stream is generated, wherein particles are ionized and are then accelerated in an electric field.

In a "radio frequency ion thruster", ions are generated by the inductive injection of a high-frequency signal. In order to generate this high-frequency signal, an oscillating circuit or frequency generator is customarily employed.

EP 3 386 275 A1 and US 2018/0 283 365 A1 describe the general layout of an ion thruster, having a frequency generator and a control device which is assigned to the frequency generator and which regulates the output of electrical energy from the frequency generator to a thruster unit of the ion thruster. The control device contains a detection unit and a computing unit. The detection unit detects the current characteristic and voltage characteristic of the electrical energy output of the frequency generator and delivers characteristic information for the current characteristic and voltage characteristic to the computing unit. The computing unit is configured to vary the voltage characteristic of the electrical energy output of the frequency generator, such that the ion thruster operates at the resonant frequency.

BRIEF SUMMARY OF THE INVENTION

An aspect of the disclosure relates to improving the efficiency of operation of a load using electrical energy in the form of an alternating current and alternating voltage, and to minimize the influence of interference upon the transmission of energy in the form of an alternating current and alternating voltage.

In particular, an aspect relates to improving the efficiency of the operation of an ion thruster and to minimizing the influence of interference upon the transmission of electrical energy to an ion thruster.

According to a first aspect, a control device for a frequency generator is disclosed. The control device comprises a detection unit and a computing unit. The detection unit is configured to detect a voltage characteristic and current characteristic of a frequency generator and to execute the transmission thereof to the computing unit. The computing unit is configured to determine a temporal offset ($\Box t_1$, $\Box t_2$) between one edge of the current characteristic and an associated edge of the voltage characteristic. The computing unit is configured to generate and vary a switching signal for the output of the voltage characteristic, in order to reduce a temporal offset between one edge of the current characteristic and an associated edge of the voltage characteristic. The detection unit is configured to detect a time point of a zero-crossing in the voltage characteristic and a time point of a zero-crossing in the current characteristic. The detection unit is configured, further to the detection of a zero-crossing in the voltage characteristic and/or of a zero-crossing in the current characteristic, to suspend any further detection of a zero-crossing in the voltage characteristic and/or of a zero-crossing in the current characteristic for a lock-out time, and only to permit a further detection of a zero-crossing in the voltage characteristic and/or of a zero-crossing in the current characteristic upon the expiry of the lock-out time.

The control device identifies both the voltage characteristic and the current characteristic, and detects the respective zero-crossings in the signal characteristics thus identified. From two sequential zero-crossings in the current characteristic, the phase and cycle time of the current characteristic is derived. From two sequential zero-crossings in the voltage characteristic, the phase and cycle time of the voltage characteristic is derived. The temporal offset between the current characteristic and the voltage characteristic can also be determined accordingly.

Any reference hereinafter to the property of a "current and/or voltage characteristic", or the employment of any similar wording, signifies that the property described relates to both the current characteristic and the voltage characteristic.

The control device described herein is employed for the actuation of a frequency generator which supplies a load with energy, in particular electrical energy. The frequency generator delivers an output of alternating current and alternating voltage to the load with variable and/or adjustable frequencies and phases. In particular, the voltage characteristic is defined by the frequency and phase angle of the voltage. In particular, the current characteristic is defined by the frequency and phase angle of the current. It is endeavored to deliver energy to the load with the maximum possible degree of efficiency. This is achieved, wherein the system is operated at the resonant frequency, such that the current characteristic and voltage characteristic are in phase, and have no mutual temporal offset.

The frequency generator outputs electrical energy to the load in the form of an alternating current and alternating voltage. The current characteristic is generally determined or influenced by the load, and varies according to circumstances on or in the load. In order to deliver an output of energy at the resonant frequency, the voltage characteristic is adjusted.

In order to adjust the output voltage characteristic, a switch mechanism is customarily employed which is actuated by means of specific switching signals and which, on the basis of these switching signals, delivers a voltage output with a corresponding voltage characteristic. The switch mechanism can be supplied with an alternating voltage or a direct voltage, and outputs the desired voltage characteristic. For an AC/AC converter or DC/AC converter of this type, known technologies can be employed.

A rising edge of the current characteristic is assigned to a rising edge of the voltage characteristic, and a falling edge of the current characteristic is assigned to a falling edge of the voltage characteristic. The computing unit permits a detection, in each case, of a temporal offset between a rising edge of the current characteristic and an associated rising edge of the voltage characteristic and/or, in each case, between a falling edge of the current characteristic and an associated falling edge of the voltage characteristic. A temporal offset between the mutually assigned edges (rising/rising and/or falling/falling) indicates that the frequency generator is operating outside the resonant frequency.

The computing unit of the control device implements an algorithm, which determines switching signals and delivers an output, to the effect that the frequency generator is regulated such that it operates at the resonant frequency. Typically, switching signals are employed to actuate a switch mechanism, which switches the voltage. In other words, for example, the voltage characteristic is aligned with the current characteristic.

The computing unit works with values which are detected and delivered by the detection unit. The detection unit detects the voltage characteristic and current characteristic on a load to which the frequency generator is coupled, and which the frequency generator supplies with power. In particular, the detection unit detects the time points of zero-crossings in the voltage and current characteristic on the load or at the output of the frequency generator. The detection unit transmits the time points of zero-crossings in the voltage and current characteristic to the computing unit. On the basis of the time points of zero-crossings in the voltage and current characteristic, the computing unit determines the temporal offset between the voltage characteristic and the current characteristic. The temporal offset between the voltage characteristic and the current characteristic can be positive or negative, depending upon whether the capacitive component or the inductive component is predominant in the reactive capacity of the load. The temporal offset thus determined is employed as a basis for the adjustment of the switching performance required for the delivery of the voltage characteristic, such that the voltage characteristic is aligned with the current characteristic. In general terms, the computing unit actuates the frequency generator such that a temporal offset between the voltage characteristic and the current characteristic is reduced or eliminated, to the effect that the load which is supplied with energy by the frequency generator is operated in resonance.

In order to operate the frequency generator at the respective resonant frequency, it is necessary for the time points of zero-crossings in the voltage and current characteristic to be reliably detected, as these time points are considered for the determination of the temporal offset between the voltage phase and the current phase, and this temporal offset is the basis for the actuation by the computing unit of the switch mechanism for the delivery of the voltage characteristic, such that the temporal offset is minimized, if not eliminated.

The system as a whole, i.e. the combination of the frequency generator and the load, and individual components of the system, i.e. the frequency generator or load, and connecting elements between the frequency generator and the load, can introduce harmonics or interference into the voltage and current characteristic. Such harmonics and interference can impact negatively upon the reliability of zero-crossings detected, for example on the grounds that harmonics in the current and voltage characteristics result in further current and voltage zero-crossings wherein, however, these further zero-crossings are zero-crossings resulting from interference. If these zero-crossings resulting from interference are considered, the temporal offset between the voltage characteristic and the current characteristic will be determined erroneously.

The control device described herein addresses this issue, and improves the reliability of the detection of zero-crossings in the current and voltage characteristic, wherein the number of zero-crossings resulting from interference is reduced or eliminated.

This is achieved wherein the detection unit, further to the detection of a zero-crossing in the voltage and/or current characteristic, suspends the detection of any further or subsequent zero-crossings for a specific time interval. This specific time interval can be a variable time interval, which is a function of the frequency setting of the current or voltage characteristic. In particular, the time interval can be expressed as a function of the frequency of the current or voltage characteristic, i.e. not necessarily as an absolute time interval, but expressed in relation to the cycle time of the current or voltage characteristic signal. The time interval during which the detection function is inhibited is described as the lock-out time.

Thus, for example, commencing from the present cycle time of the current and voltage characteristic, detection of the respective following zero-crossing can be suspended or inhibited for a duration of 75% of the respective cycle time. In this example, detection of the following zero-crossing will be possible again one quarter-cycle in advance of the next anticipated zero-crossing (on the basis of the present cycle time). Thus, it is also possible for a zero-crossing to be detected which occurs earlier than the zero-crossing which is anticipated on the basis of the present cycle time. The lock-out time is thus a definable and variable component with respect to the present cycle time of the respective signal (current or voltage characteristic). Typically, the lock-out time is less than 100% of the present cycle time. The duration of the lock-out time can be variably defined, depending upon anticipated fluctuations in the cycle time of signal characteristics which are to be captured in sequential cycles. If it is anticipated that the cycle time of two sequential cycles will vary by less than 20%, it is appropriate that the lock-out time should be set at 80%, or slightly lower. In the above example, the lock-out time is 75% of the present cycle time. In each case, the lock-out time follows the detection of a zero-crossing. Immediately a zero-crossing has been detected, the lock-out time during which the detection of a zero-crossing is inhibited will commence.

Upon the expiry of the lock-out time, detection of a zero-crossing is again permitted. The detection unit can thus release a corresponding input for the detection of signals which are to be identified (current and voltage characteristics), or the processing of values which are present on these inputs can be resumed. The time interval during which the detection of zero-crossings is resumed is described as the detection time. The detection time directly follows the lock-out time. Immediately the lock-out time ends, the detection time commences forthwith.

In the above-mentioned example, the detection time commences further to a lock-out time which is equal to 75% of the current cycle time. Thus, a zero-crossing can also be detected which occurs 25% earlier than the time anticipated on the basis of the present cycle time.

In order to identify a zero-crossing which occurs later than a zero-crossing which is anticipated on the basis of the present cycle time, the detection time is extended beyond the anticipated time point of a zero-crossing by the same proportion of a cycle time by which the lock-out time is shorter than the present cycle time. In the present example, the lock-out time is 25% shorter than the current cycle time (the lock-out time is set at 75% of the present cycle time). The detection time for a zero-crossing thus extends from a time point which precedes the anticipated zero-crossing by 25% of the cycle time to a time point which succeeds the anticipated zero-crossing by 25% of the cycle time.

Immediately a zero-crossing in the current and/or voltage characteristic is detected during the detection period, the present cycle time is recalculated and, on the basis of the recalculated present cycle time, the lock-out time and the detection time for the next cycle are defined.

The lock-out time and the detection time can be implemented by means of semiconductor components. For example, a circuit can be employed which permits the detection of zero-crossings by the use of edge-triggered flip-flops, wherein a signal which is present on an input of the flip-flop (a current and/or voltage characteristic) is/is not relayed for further processing. As the flip-flop operates with a corresponding working signal at a dedicated frequency, the time interval during which the flip-flop does/does not relay the signal which is present on its input for further processing in the detection unit can be defined. The working signal has a frequency which is higher than the frequency of current and voltage characteristics which are to be identified. Thus, by means of edge-triggered flip-flops, which are controlled by the rising or falling edges of the working signal, the start and end of the lock-out time and the start and end of the detection time can be defined. As the frequency of the working signal is higher than the frequency of current and voltage characteristics which are to be identified, and the end of the lock-out time typically occurs on a rising or falling edge of the working signal, the lock-out time is shorter than the cycle time of current and voltage characteristics which are to be identified.

Given that, further to the detection of a zero-crossing in the current and/or voltage characteristic, detection of a subsequent zero-crossing is inhibited for the lock-out time, zero-crossings which are caused by interference, such as harmonics, are not spuriously identified as genuine zero-crossings. Any such spuriously identified zero-crossings, which are based upon interference, can severely handicap the setting of the resonant frequency of the frequency generator. As the detection unit, for the detection of valid zero-crossings, employs a detection time of a definable duration, the frequency generator can be more rapidly set to the respective appropriate resonant frequency, or the frequency generator can respond more rapidly to variations in the resonant frequency, and can also assume an appropriate resonant frequency setting.

According to one embodiment, the detection unit is configured to permit the resumed detection of a zero-crossing in the voltage characteristic and/or of a zero-crossing in the current characteristic further to the expiry of the lock-out time, for the duration of a detection time. The detection time directly follows the lock-out time and has a duration equal to double the difference between the present cycle time of the voltage characteristic and/or of the current characteristic and the proportion of the lock-out time to which this present cycle time corresponds.

On the basis of the above-mentioned example, the lock-out time assumes a duration of 75% of the present cycle time of the current and/or voltage characteristic. The detection time thus commences one quarter-cycle in advance of the next anticipated zero-crossing (based upon the present cycle time). However, the detection time does not terminate at the anticipated time point of the next zero-crossing, but is prolonged beyond this anticipated time point, in order to permit the detection of subsequent zero-crossings.

In the present example, the difference between the present cycle time of the voltage characteristic and/or of the current characteristic and the proportion of the lock-out time for the present cycle time is thus 25%, as the present cycle time is established at 100%, and the lock-out time assumes a proportion of 75% thereof. The detection time has a duration which corresponds to double this difference, i.e. 50% of the present cycle time. According to a further embodiment, the detection unit is configured to transmit a zero-crossing which is detected during the detection time to the computing unit. The computing unit is configured, on the basis of the zero-crossing which is detected during the detection time, to redetermine the present cycle time of the current and/or voltage characteristic thus detected. The computing unit is configured, on the basis of the redetermined cycle time for the detected current and/or voltage characteristic, to redefine the lock-out time and the detection time.

For example, the computing unit can transmit the new duration of the lock-out time and the detection time to the detection unit. However, the computing unit can also transmit the recalculated cycle time of the detected current and/or voltage characteristic to the detection unit, and the lock-out time and detection time are derived automatically as a proportion of the recalculated cycle time (in the above-mentioned example: lock-out time=75% of the recalculated cycle time, detection time=2×25% of the recalculated cycle time).

If the detection of zero-crossings is inhibited or permitted by means of edge-triggered flip-flops, the working signal can be adjusted in accordance with the recalculated cycle time of the detected current and/or voltage characteristic, such that the percentage of the lock-out time and the detection time, as a proportion of the cycle time of the detected current and/or voltage characteristic, remains the same. The lock-out time and the detection time do not necessarily need to be calculated as values, but can be derived automatically as a proportion of the recalculated cycle time of the detected current and/or voltage characteristic, and from the adjusted frequency of the working signal of flip-flops.

In other words, the lock-out time and the detection time are defined indirectly, by means of a redetermined cycle time of the detected current and/or voltage characteristic, as the lock-out time and the detection time extend over a specified proportion of the recalculated cycle time, and are thus indirectly dependent upon the recalculated cycle time.

According to a further embodiment, the redefined lock-out time directly follows the zero-crossing which is detected during the detection time.

Immediately a zero-crossing is detected during the detection time, the redefined lock-out time follows this zero-crossing. This means that the control device, for the next cycles of the current and/or voltage characteristic to be detected, operates with the redefined lock-out time and the redefined detection time.

Whether a zero-crossing is detected as a valid zero-crossing is thus consistently dependent upon the cycle time of the detected current and/or voltage characteristic. If this cycle time changes, there is also an associated change in the duration of the lock-out time and the detection time. Abrupt variations in the cycle time, i.e. changes in which the cycle time of two sequential cycles alters by more than one half of the detection time, are thus not considered for the adjustment of the switching frequency of the voltage characteristic.

According to a further embodiment, the detection unit comprises a low-pass filter, wherein the low-pass filter is configured to filter out signal components of the detected current and/or voltage characteristic which exceed a definable frequency threshold value.

The impact of harmonics or other forms of interference in the detected current and/or voltage characteristic is thus attenuated, and the number of zero-crossings which are caused by harmonics or interference (invalid zero-crossings, spurious zero-crossings) is reduced.

By means of the low-pass filter, for example, signal components are filtered out which have a frequency which is at least three to four times higher than the frequency of the fundamental wave.

According to a further embodiment, the detection unit is configured to identify the time point of a zero-crossing in the voltage characteristic and/or the time point of a zero-crossing in the current characteristic, subsequently to the filtering of the current and/or voltage characteristic by the low-pass filter.

This means that the detected current and/or voltage characteristics firstly undergo filtering by the low-pass filter, before the detection of zero points is executed by the detection unit. The low-pass filter thus filters-out interference from the detected current and/or voltage characteristics, and ensures the reliable detection of zero points in the ground wave, and thus of the uncorrupted (actual) current and/or voltage characteristic.

According to a further embodiment, the control device comprises a time-delay element, wherein the time-delay element is configured to add a delay to the time point of a detected zero-crossing in the voltage characteristic and/or of a detected zero-crossing in the current characteristic, before the computing unit determines the temporal offset ($\Box t_1, \Box t_2$) between one edge of the current characteristic and an associated edge of the voltage characteristic.

By means of the time-delay element, a delay to the time point of zero points detected is introduced.

Depending upon which semiconductor components are employed in the control device, these components can introduce an inherent delay into switching processes, which can result in an erroneous determination of the temporal offset between the current characteristic and the voltage characteristic. The delay introduced by the time-delay element to the time point of zero points detected offsets the delay associated with semiconductor components. If MOSFETs are employed, for example, it can be appropriate to execute off-load switching. If capacitively loaded switching components are employed, such as, for example, MOSFETs, the time point of the zero-crossing in the voltage characteristic is delayed, in order to permit off-load switching of the capacitively loaded switching component.

The time-delay element can be supplied with two values: the present cycle time or frequency and the magnitude of the delay.

The magnitude of the delay can be a phase displacement, which is dependent upon the capacitance of the capacitively loaded switching component. In particular, the phase displacement is proportional to this capacitance.

This delay, which is introduced by the time-delay element, compensates any stray delays which are introduced into the time points of zero-crossings, thereby enhancing the accuracy of the temporal offset determined between one edge of the current characteristic and an associated edge of the voltage characteristic, as a result of which the setting of the resonant frequency of the frequency generator can be executed with a higher degree of accuracy.

According to a further embodiment, the delay is a phase displacement, which is related to the cycle time of the detected current and/or voltage characteristic.

The phase displacement is customarily an offset which is equal to a specific proportion of the cycle time, which remains constant in relation to the phase. Conversely, the absolute time interval will vary, in response to a change in the cycle time of the detected current characteristic and/or voltage characteristic.

According to a second aspect, an ion thruster is disclosed. The ion thruster comprises a frequency generator and a control device, as described heretofore and hereinafter. The frequency generator is configured to output electrical energy at a definable frequency for the current and voltage characteristic of electrical energy, in order to generate an electric field in the ion thruster. The control device is coupled to the frequency generator, in order to operate the frequency generator at a specified frequency, such that a propellant is ionized in the electric field.

An ion thruster of this type can be employed, for example, in space travel, for the propulsion of spacecraft. The ion thruster can also be employed in satellites. The ion thruster can be employed to bring satellites into a specific orbit, or for the maintenance thereof in a specific orbit.

The above-mentioned control device provides an advantage, in that the resonant frequency of current and voltage characteristics for the operation of the ion thruster can be reliably set with a high degree of accuracy. It is also possible for a thruster unit (plasma chamber, coil and other components arranged in the plasma chamber) to be replaced, or for an electrical connection with a greater conductor length to be employed between the frequency generator and the thruster unit, as the control device described herein offsets any interference associated with the electrical connection, or any deviations in the matching of the thruster unit and the frequency generator, or adjusts to these deviations and is nevertheless capable of executing a reliable setting of the resonant frequency.

According to one embodiment, the frequency generator comprises an oscillating circuit, and the oscillating circuit is a R-L-C oscillating circuit.

According to a further embodiment, the frequency generator comprises a semiconductor switch mechanism, which is coupled to the oscillating circuit and is configured to actuate the oscillating circuit in accordance with the switching signal of the control device.

Ion thrusters incorporating measures for plasma energy protective apparatuses are described hereinafter. Plasma energy protective apparatuses are employed for the accommodation of any power flashover from a thruster unit to a power supply unit of the ion thruster, in order to prevent damage to the power supply unit. As measures for plasma energy protective apparatuses, an energy compensation unit, an adapter unit and an interference suppression unit are described, each of which can be implemented individually, or in combination with one or both of the other measures in an ion thruster. These plasma energy protective apparatuses can be employed in combination with, or separately from the above-mentioned control device in an ion thruster.

According to a third aspect, an ion thruster is disclosed. The ion thruster comprises a thruster unit and a power supply unit having a switch mechanism. The switch mechanism comprises an energy compensation unit. The energy compensation unit is arranged in the switch mechanism on the output side, and is configured to at least partially accommodate a power flashover from the thruster unit to the power supply unit. The energy compensation unit is configured as a low-capacitance bipolar voltage limiter.

The thruster unit is generally the unit which is supplied with electrical energy, and which generates thrust. The power supply unit incorporates, for example, a frequency generator and a control device as described herein, and supplies electrical energy for the thruster unit.

The ion thruster described herein can be operated with a control device, as represented in conjunction with a number or all of the aspects and embodiments from the present description. However, it is also possible for the ion thruster according to the present aspect to be employed with a conventional control device, in the absence of a number of features of the control device according to other aspects and embodiments of the control device described herein.

The energy compensation unit is employed for accommodation of a power flashover, for example a voltage flashover, from the thruster unit to the power supply unit, thereby preventing any impact of the power flashover upon further electronic components of the power supply unit, and any damage thereto.

An ion thruster typically comprises two power circuits: a first electric power circuit in the thruster unit, for the generation of plasma and the acceleration of ionized particles, by means of which thrust is generated, and a second power circuit in the power supply unit, which generates and supplies electrical energy. A power flashover from one power circuit to the other power circuit can influence the operation of the ion thruster in an unwanted manner. In particular, a power flashover from the thruster unit to the power supply unit can be undesirable. In such a power flashover, for example, energy from the thruster unit is conducted via the plasma in the plasma chamber to the power supply unit. Electronic components of the power supply unit can be damaged as a result. In order to prevent this, an energy compensation unit is arranged in the switch mechanism. This absorbs a voltage flashover from the plasma chamber to the power supply unit, and thus protects the other electronic components of the power supply unit.

According to one embodiment, the energy compensation unit comprises a first branch and a second branch, wherein the first branch comprises a first high-voltage diode and a first suppressor diode which is series-connected and inversely connected thereto, wherein the second branch comprises a second high-voltage diode and a second suppressor diode which is series-connected and inversely connected thereto, wherein the first high-voltage diode is inversely connected to the second high-voltage diode, and wherein the first suppressor diode is inversely connected to the second suppressor diode.

By means of this layout, the energy compensation unit permits a bipolar voltage limitation, and is thus of a low-capacitance design. An energy compensation unit thus configured can be employed for the maximum possible take-up of energy from a power flashover in the thruster unit, which energy is thus withheld from the remaining electronic components of the power supply unit.

According to a fourth aspect, an ion thruster is disclosed. The ion thruster comprises a thruster unit and a power supply unit, having a switch mechanism. The switch mechanism comprises an adapter unit. The adapter unit comprises a first interface and a second interface. The adapter unit is configured for the take-up of electrical energy from electronic components of the power supply unit via the second interface, and for the output of electrical energy to the thruster unit via the first interface. The first interface is galvanically isolated from the second interface.

For the general layout of an ion thruster, reference may be made to the description of the ion thruster according to other aspects and examples included in the present description.

By the design of the ion thruster with an adapter unit, galvanic isolation is implemented between the thruster unit on the one hand, and the remaining electronic components of the power supply unit on the other. Any power flashover from the thruster unit to the power supply unit can thus be suppressed.

The adapter unit can contain, for example, a first coil at the first interface and a second coil at the second interface. Electrical energy in the form of an alternating current is injected into the second coil, transmitted to the first coil, and relayed from thence to the thruster unit. A core can be arranged between the first and second coils.

In the adapter unit, the function of a transformer is thus implemented. A transformation ratio between the first interface and the second interface can also be implemented herein. One coil, for example the second coil, can be connected via a capacitance to ground.

The adaptation unit can also contribute to the achievement of a more effective electrical adaptation of the power supply unit to the thruster unit, thus permitting an improved efficiency of the ion thruster.

The adaptor unit can be employed in combination with, or separately from the above-mentioned energy compensation unit in an ion thruster. Likewise, the adapter unit in an ion thruster can be employed in combination with or separately from the control device, according to other aspects and embodiments described herein.

According to a fifth aspect, an ion thruster is disclosed. The ion thruster comprises a thruster unit, a power supply unit and an interference suppression unit. The interference suppression unit is arranged at an interface between the power supply unit and the thruster unit, and is configured to accommodate and suppress interference in an electrical connection between the power supply unit and the thruster unit. By way of a voltage divider, the interference suppression unit comprises a mutually interconnected inductance and capacitance. The electrical connection connects the thruster unit to a node point between the inductance and the capacitance.

For the general layout of an ion thruster, reference may be made to the description of the ion thruster according to other aspects and examples included in the present description.

By the design of an ion thruster incorporating an interference suppression unit, harmonics and interference in the electrical connection between the power supply unit and the thruster unit are suppressed. In particular, interference and harmonics associated with a power flashover from the thruster unit to the power supply unit can be suppressed accordingly. Naturally, the interference suppression unit is also employed for the suppression of interference and harmonics resulting from another cause such as, for example, interference and harmonics associated with the electrical connection between the power supply unit and the thruster unit. The interference suppression unit thus contributes to the possibility for the employment of longer electrical conductors between the power supply unit and the thruster unit than would be the case, were no interference suppression unit employed.

In particular, the interference suppression unit comprises a L-C voltage divider. A capacitor from the oscillating circuit, which is present in an ion thruster in any event, can be employed for the implementation of this L-C voltage divider. The inductance and capacitance of the interference suppression unit, in combination with the coil of the thruster unit, form a L-C-L oscillating circuit, which contributes to the stabilization of the frequency of electrical signals on the conductor between the power supply unit and the thruster unit.

The interference suppression unit can be employed in combination with, or separately from the above-mentioned energy compensation unit and/or the adapter unit in an ion thruster. Likewise, the interference suppression unit in an ion thruster can be employed in combination with, or separately from the control device, according to other aspects and embodiments described herein.

BRIEF DESCRIPTION OF THE DRAWINGS

A number of features are described in greater detail hereinafter, with reference to the drawings. The representations are schematic, and not true to scale. Identical reference numbers identify identical or similar elements. In the figures.

DETAILED DESCRIPTION

Figure 1:
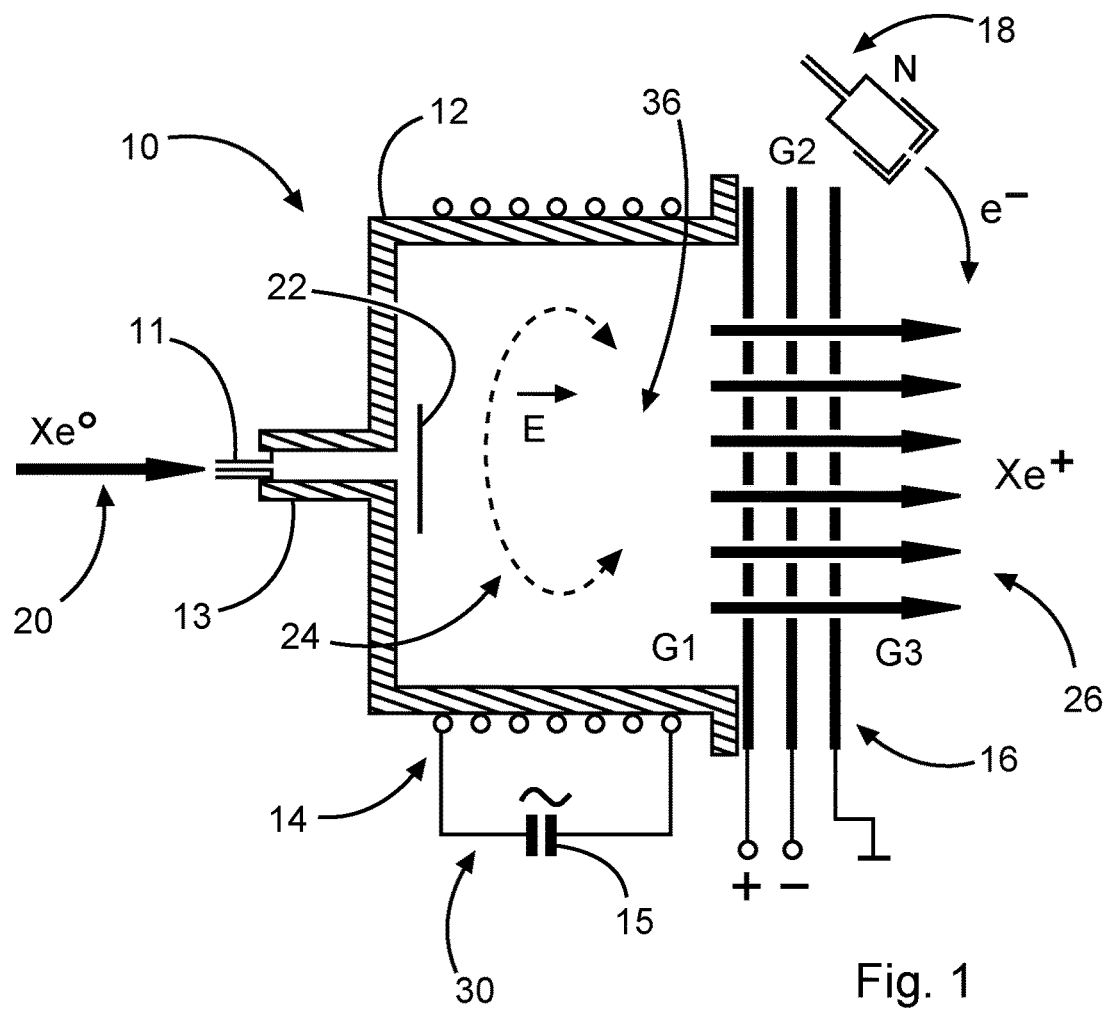
FIG. 1 shows a schematic representation of an ion thruster.

FIG. 1 shows a schematic representation of an ion thruster 10. The ion thruster 10 comprises a housing 12 and an oscillating circuit 30 having a coil 14. The coil 14 is arranged on the housing 12 such that an electric field 24 can be generated in the interior of the housing 12. A propellant 20 is supplied to the housing 12 via a line 11. The propellant can be, for example, a noble gas such as, for example, xenon. It is also conceivable that other propellants are employed, such as, for example, iodine. The line 11, for example, is a metallic line or a metallic pipe. The line 11 is coupled to the terminal 13 of the housing 12, such that propellant can be conveyed from the line 11 via the terminal 13 into the housing 12. In the interior of the housing 12, a cathode 22 is arranged, in order to ionize particles of the propellant 20, in cooperation with the electric field 24. In the interior of the housing 12, plasma 36 is located. A grid array 16 of grids G1, G2, G3 is configured for the acceleration of ionized particles of the propellant 20 and the formation of an ion stream 26, which generates a force by the recoil principle. In order to neutralize the ion stream 26 leaving the housing 12, a neutralization unit 18 is provided.

The oscillating circuit 30 is preferably operated at its resonant frequency, in order to reduce electrical losses, and in the interests of an effective propulsion of the ion thruster. The oscillating circuit 30 is formed by the capacitance 15 and the coil 14, which extends about the housing 12. The plasma 36 influences the inductance of the coil 14, such that the coupling thereof varies. The coil 14 thus assumes a dynamic inductance, i.e. its inductance value varies according to the operation of the ion thruster, as a result of which the resonant frequency of the oscillating circuit 30 also varies. For this reason, both the frequency and the pulse width of the oscillating circuit 30 must be controlled.

Figure 7:
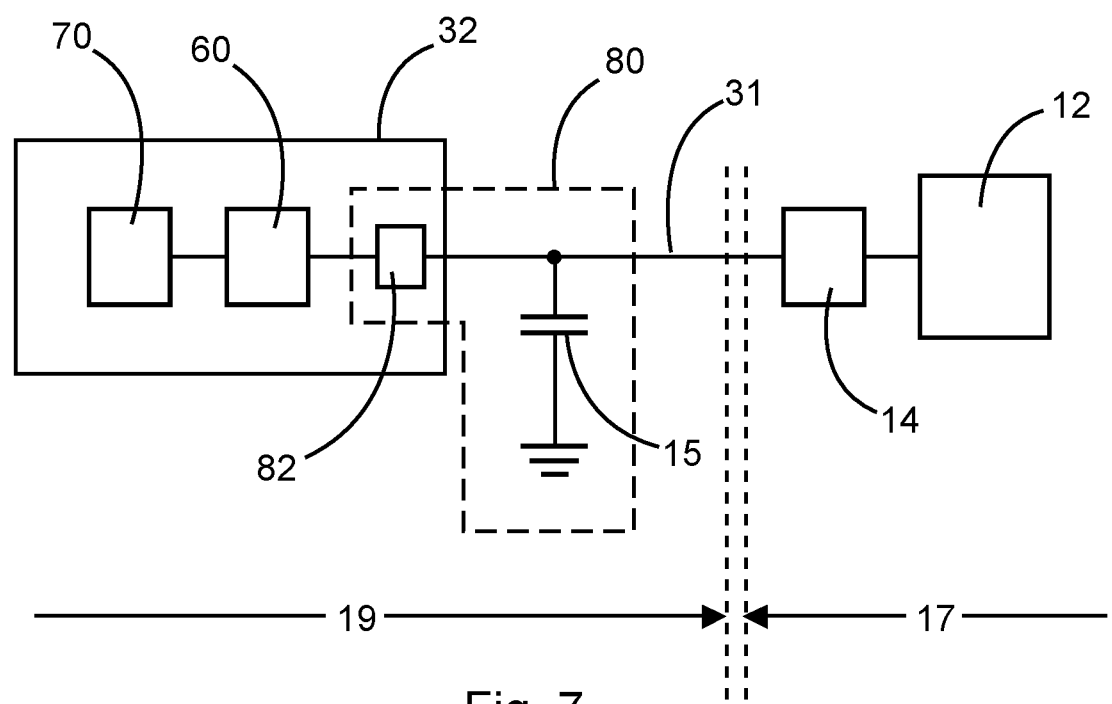
FIG. 7 shows a schematic representation of functional units of an ion thruster, incorporating measures for plasma energy protective apparatuses.

The capacitance 15 is configured as an electrical capacitor, and is customarily a constituent of a power supply unit 19 (see FIG. 7), whereas the coil 14 is assigned to the thruster unit 17 (see FIG. 7). The coil 14 and the capacitance 15 are connected by an electrical conductor 31 (see FIG. 2 and FIG. 7), such that electrical energy can be transmitted to the thruster unit. The electrical conductor 31 permits the thruster unit to be spatially separated from the power supply unit, or the arrangement thereof with a mutual clearance.

Figure 2:
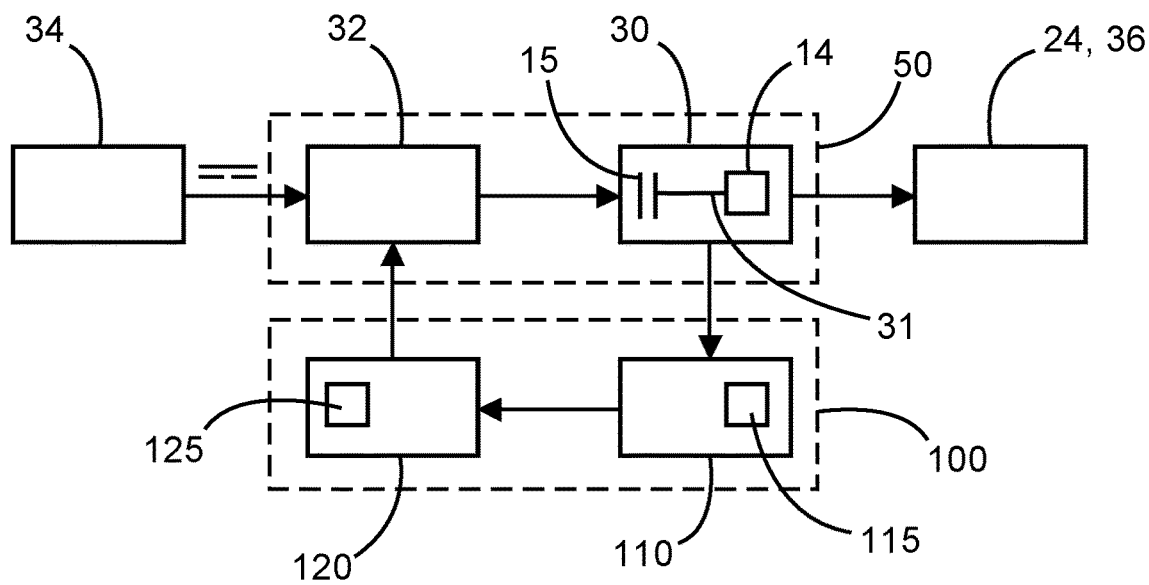
FIG. 2 shows a schematic representation of the functional units of an ion thruster.

FIG. 2 shows a schematic representation of the functional layout of an ion thruster and the components thereof, principally the control circuit for the electric field 24 or the load 36 with plasma. A voltage supply 34 provides electrical energy for the operation of the frequency generator 50 and the control device 100. The frequency generator 50 comprises a switch mechanism 32 and an oscillating circuit 30. The switch mechanism 32 is configured to switch a voltage value, such that the oscillating circuit 30 is supplied with voltage and operates at a specified frequency.

The oscillating circuit 30 is formed by the capacitance 15 and the coil 14, which are electrically interconnected by means of the conductor 31.

The frequency of the oscillating circuit 30 is monitored and controlled by the control device 100. To this end, the control device 100 comprises a detection unit 110 and a computing unit 120. The detection unit 110 is configured to detect the current characteristic and the voltage characteristic on the oscillating circuit 30, as graphically described hereinafter with reference to FIG. 3. On the basis of values detected by the detection unit 110, the computing unit 120 determines a phase angle of the current characteristic and the voltage characteristic, in order to influence the switching performance of the switch mechanism 32, at least indirectly, on the basis of this phase angle.

The detection unit 110 comprises a low-pass filter 115. A detected current and/or voltage characteristic is routed to the low-pass filter, and harmonics with effect from a specified frequency value are filtered-out herefrom or damped, such that harmonics have no adverse influence upon the detection of zero-crossings in the current and/or voltage characteristics.

The computing unit 120 comprises a time-delay element 125. The time-delay element is configured to add a time delay to the time point of a zero-crossing in the current and/or voltage characteristic which is detected and delivered by the detection unit 110, in order to offset internal delays associated with the processing of zero-crossings.

The oscillating circuit 30 is arranged to generate an electric field 24, such that an ion stream is initiated and maintained in the ion thruster for the supply of propulsive energy which can be employed, for example, for a satellite or spacecraft.

Figure 3:
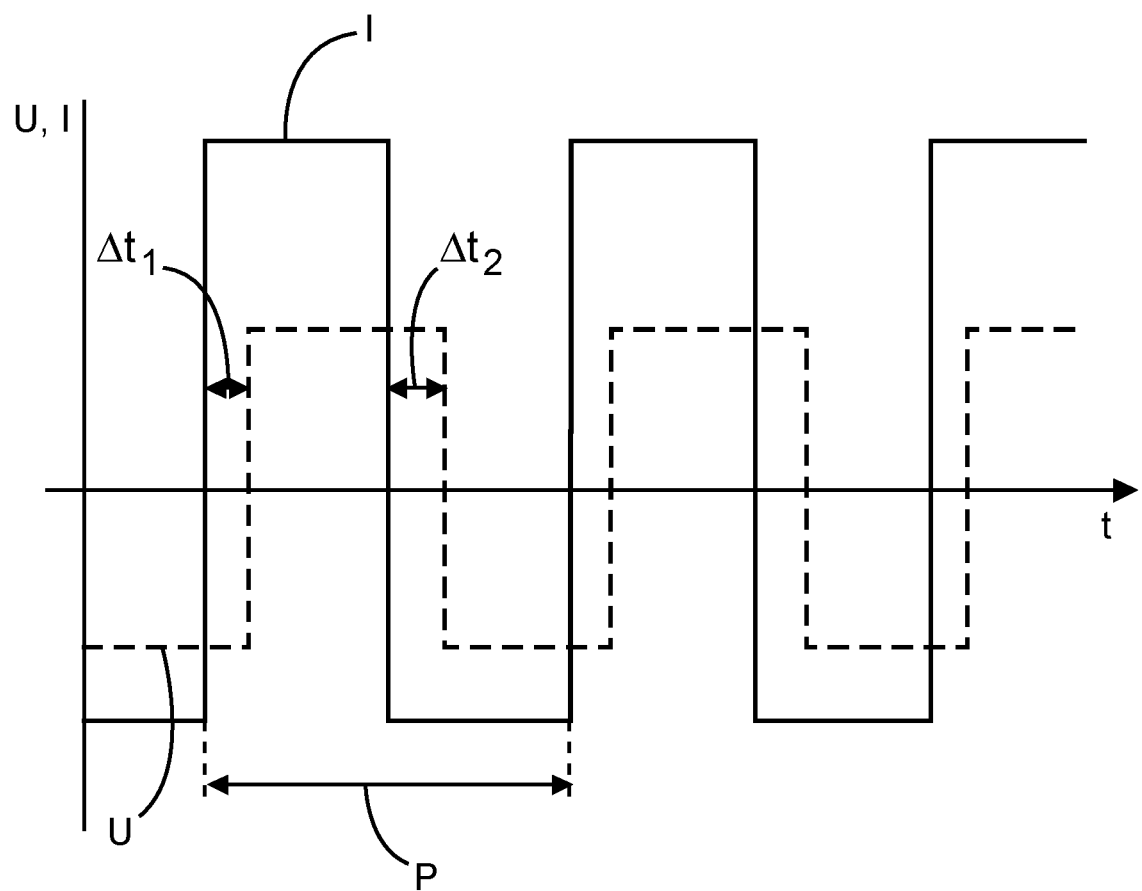
FIG. 3 shows a schematic representation of a current and voltage characteristic of an oscillating circuit of an ion thruster.

FIG. 3 shows an exemplary current (I) and voltage characteristic (U) over time (t), together with the phase angle between current and voltage. Current and voltage are respectively represented as square-wave signals, wherein the current characteristic is represented by a solid line and the voltage characteristic is represented by a broken line. One cycle p of the signal characteristic is also plotted, and extends in time respectively from rising edge to rising edge, or from falling edge to falling edge.

From the current and voltage characteristic represented in FIG. 3, a phase displacement $\Box t_1$ between the rising edges can be observed. If this temporal phase displacement is defined as the difference between the zero-crossing in the voltage characteristic and the associated zero-crossing in the current characteristic, the value of the temporal phase displacement $\Delta t_1$ shown here is a positive value. It is naturally conceivable that this temporal phase displacement $\Delta t_1$, depending upon the characteristic of the oscillating circuit, can also be negative, and that its absolute value (temporal duration) can vary.

In addition to the temporal offset of the rising edges, depending upon the pulse width (duty cycle) of current and voltage, a second temporal offset $\Delta t_2$ also occurs between the falling edges. For the second temporal offset, the same fundamental comments apply as those set out above with reference to the first temporal offset $\Delta \Delta t_1$, such that reference may be made thereto.

Under resonant conditions, and in the event of a correctly set pulse width, there is no significant phase displacement between the current characteristic and the voltage characteristic, either on the rising edge or the falling edge. Conversely, in the event of capacitive behavior of the oscillating circuit, the current runs ahead of the voltage, such that it is necessary for the frequency to be increased. Alternatively, in the event of inductive behavior of the oscillating circuit, the voltage runs ahead of the current, such that it is necessary for the frequency to be reduced.

Figure 4:
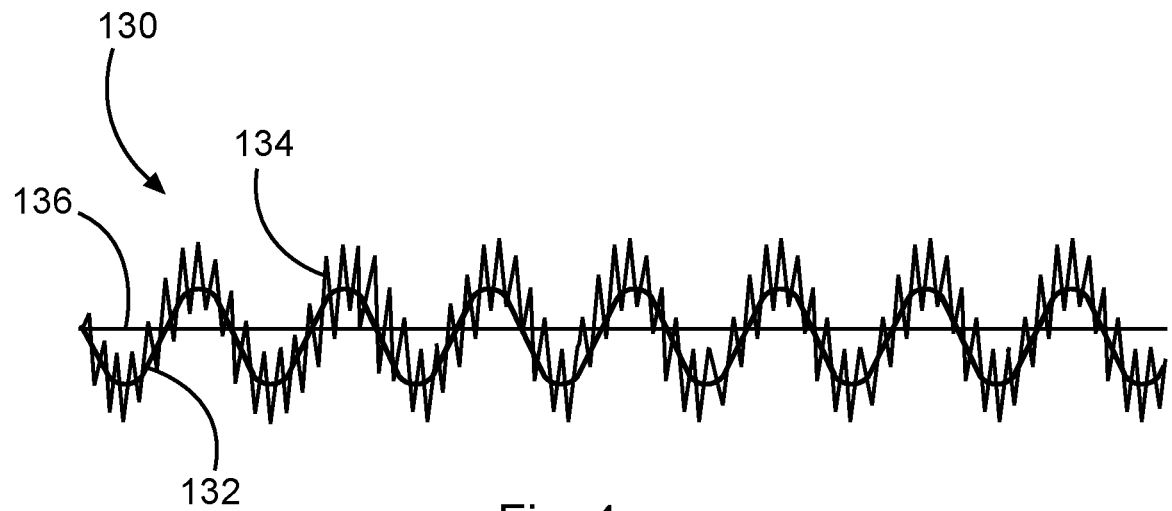
FIG. 4 shows a schematic representation of a detected signal characteristic, having a fundamental wave and a harmonic.

FIG. 4 shows an exemplary and schematic representation of a signal characteristic which is detected by the detection unit 110 (prior to any further processing by other components), which represents the voltage characteristic or current characteristic.

The signal characteristic 130 represents a superimposition of one or more harmonics 134 upon the fundamental wave 132. The fundamental wave 132 is, for example, a sine characteristic, or another model-specific signal characteristic. The harmonic 134 is a wave which is superimposed on the fundamental wave, having a frequency which is higher than the frequency of the fundamental wave. The signal characteristic 130 oscillates periodically about the zero line 136.

As can clearly be seen, the harmonic 134 can corrupt the fundamental wave 132 such that, within a short time of a zero-crossing in an ideal fundamental wave 132, further zero-crossings can occur, which are caused by the harmonic 134.

The detection unit 110 can thus detect multiple zero-crossings, which can impact upon the accuracy of the setting of the frequency generator. As a result, the resonant frequency on the oscillating circuit 30 can be inaccurately set, thereby potentially resulting in a poor efficiency of the ion thruster.

The low-pass filter 115 filters harmonics 134 out of the signal characteristic 130, such that the number of zero-crossings is reduced and, in particular, "spurious" zero-crossings caused by harmonics 134 are eliminated.

Figure 5:
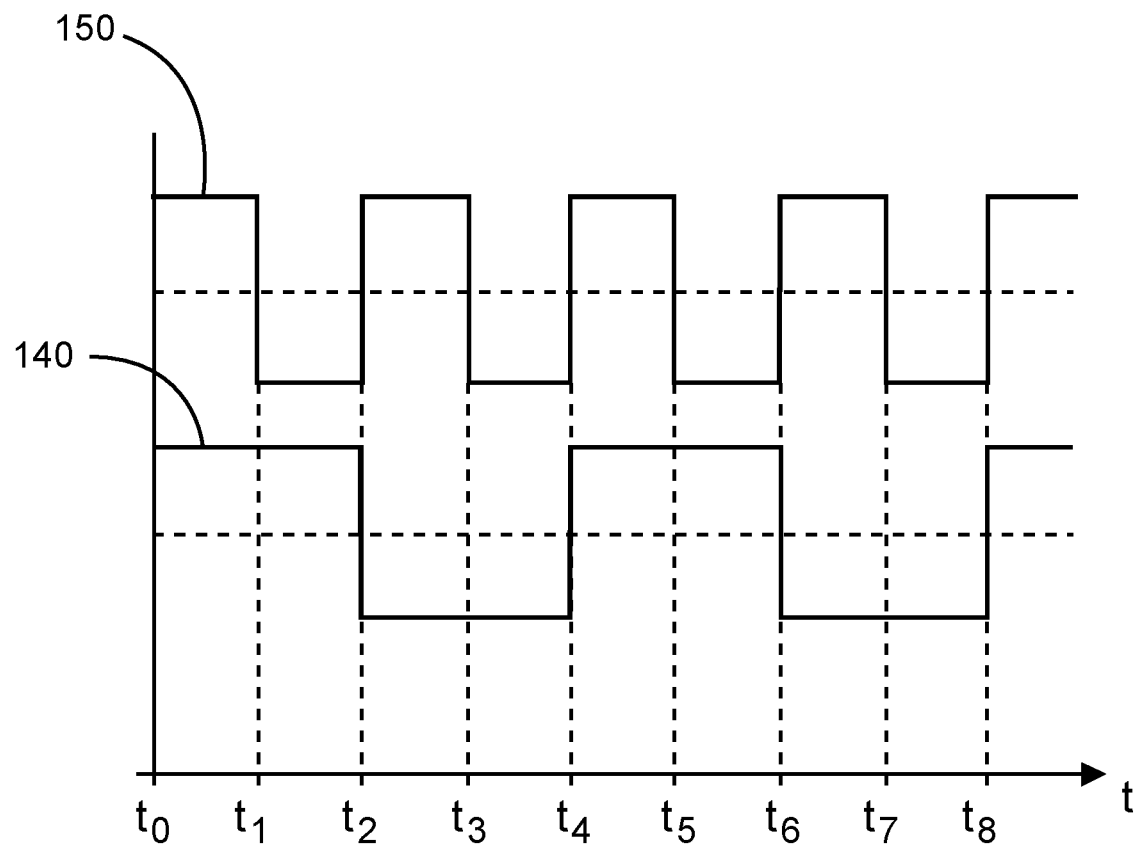
FIG. 5 shows a schematic representation of a voltage characteristic, including a representation of time periods for the detection of zero-crossings.

FIG. 5 shows a schematic representation of an exemplary implementation by the control device 100 of the lock-out time and the detection time for the detection of zero-crossings in the current and/or voltage characteristic.

The signal characteristic 140 schematically represents a switching signal having a switching signal frequency or cycle time which extends over four time periods $t_0$ to $t_4$. The signal characteristic 140 represents, for example, the switching signal at the switching frequency of the voltage signal for the ion thruster. A second signal characteristic 150 is contrasted with the signal characteristic 140. The second signal characteristic 150 can be designated as an internal working signal of the frequency generator. The second signal characteristic 150 assumes a frequency which is higher than the frequency of the signal characteristic 140 and, in particular, is a whole number multiple thereof, for example double the value thereof. This means that, in this example, one cycle of the second signal characteristic 140 extends over two time periods, from $t_0$ to $t_2$.

By means of the second signal characteristic 150, semiconductor components, for example edge-triggered flip-flops, can be actuated, in order to transmit or block a signal at their output, at which the signal which is to be detected is present (current and/or voltage characteristic) for further processing. The transmission or blocking of a signal input on the detection unit can thus be implemented in hardware in an automated manner, thereby permitting a more rapid response.

Immediately a zero-crossing has been identified in the signal which is to be detected (e.g. the current or voltage characteristic of the energy supply of the ion thruster), detection of the next zero-crossing is inhibited for a definable time interval. This time interval is dependent upon the frequency of the signal which is to be detected. For example, the next zero-crossing in a detected signal will only be validly identified at a time interval of $-t/4$ to $+t/4$ of the next anticipated zero-crossing, based upon the current frequency setting of the signal which is to be detected.

In the example according to FIG. 5, a zero-crossing in a signal characteristic has been detected at $t_0$, such that the detection of the next zero-crossing is then blocked or inhibited for a given time interval; this time interval can also be described as the lock-out time. In the above-mentioned example, this lock-out time runs up to time point $t_3$. In the present example, time point $t_3$ is one quarter-cycle of the signal 140 in advance of the next zero-crossing at $t_4$. With effect from time point $t_3$, valid detection of zero-crossings in the detected signal resumes. The detection time for zero-crossings thus commences at time point $t_3$. The detection time continues up to time point $t_5$, which lies one quarter-cycle of the present frequency setting of the signal 140 which is to be detected after time point $t_4$. Valid detection of a zero-crossing is possible in the time between $t_3$ and $t_5$. From the detection of a zero-crossing up to time point $t_3$, detection of a zero-crossing is inhibited. Customarily, variations in the frequency of the signal which is to be detected can thus be sufficiently accommodated, i.e. the frequency generally varies such that, notwithstanding the variation in frequency, the next zero-crossing occurs in the detection time between $t_3$ and $t_5$. By means of this approach, spurious zero-crossing detections are reduced, as the valid detection of zero-crossings is restricted to an appropriate time interval.

The example described here presumes that the lock-out time is equal to 75% of the present cycle time, as indicated above in the description of one example. The detection time is then double the difference between the anticipated cycle time (on the basis of the present cycle time, it is anticipated that the next zero-crossing will occur at $t_4$) and the lock-out time. In other words, the lock-out time extends over three time periods from $t_0$ to $t_3$, and the detection time over two time periods from $t_3$ to $t_5$.

Figure 6:
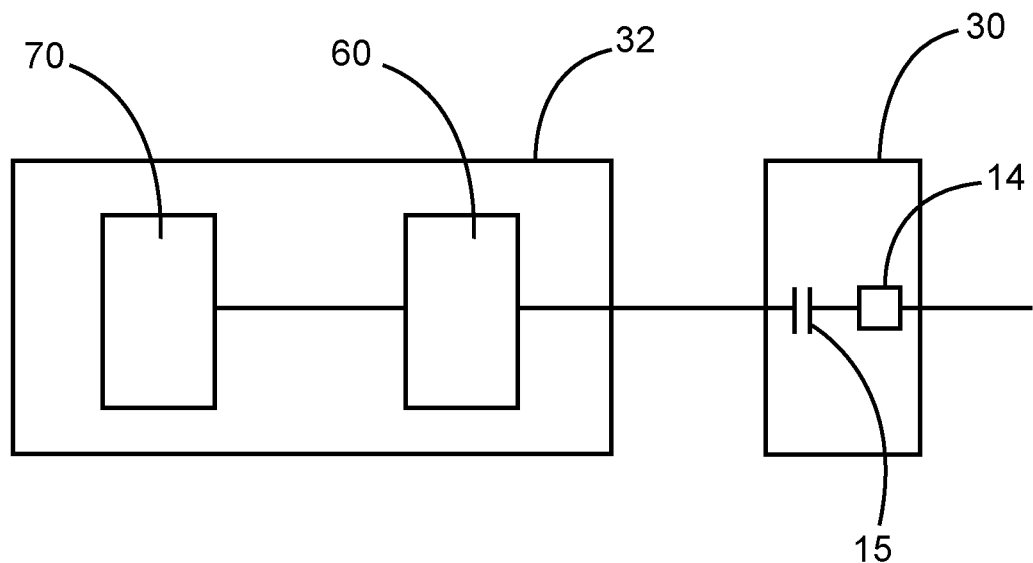
FIG. 6 shows a schematic representation of functional units of an ion thruster, incorporating measures for plasma energy protective apparatuses.

FIG. 6 shows a switch mechanism 32 and an oscillating circuit 30 of an ion thruster, as described above, for example with reference to FIG. 1. In principle, the switch mechanism 32 executes the above-mentioned function which is assigned thereto. In the switch mechanism 32, an energy compensation unit 60 and an adapter unit 70 are arranged. The energy compensation unit 60 and the adapter unit 70 are plasma energy protective apparatuses, which attenuate the effects of any power flashover on the ion thruster from the thruster unit to the power supply unit, and prevent damage to the power supply unit (all those elements which, from the perspective of the thruster unit or the perspective of the oscillating circuit 30, are arranged down-circuit of the adapter unit 70).

The energy compensation unit 60 and the adapter unit 70 are described hereinafter with reference to FIG. 8 and FIG. 9.

A power flashover from the thruster unit to the power supply unit can occur, for example, if grid G1 in the grid array 16 assumes contact with the plasma 36, as a result of which an electric voltage is transferred via the plasma 36 to the terminal 13 and the propellant line 11, such that the propellant line 11 is at the same potential as the grid G1—see representation in FIG. 1. From the propellant line 11, a voltage flashover can occur to the coil 14 which, in turn, introduces energy to the capacitor 15 and the power supply unit.

FIG. 7 is based upon the representation according to FIG. 6, wherein the interference suppression unit 80, in addition to the energy compensation unit 60 and the adapter unit 70, represents an additional plasma energy protective apparatus.

The interference suppression unit 80 is arranged at the interface between the power supply unit 19 and the thruster unit 17, i.e. on the oscillating circuit which is formed by the capacitor 15 and the coil 14 of the thruster unit 17. The interference suppression unit 80 itself comprises an inductance 82, which is interconnected with the capacitor 15 by way of a voltage divider, wherein the capacitor 15 is connected to ground. The coil 14 is electrically connected to the node point between the inductance 82 and the capacitor 15.

In the employment of plasma devices, in which plasma is generated by alternating electric fields (e.g. in an ion thruster), short-circuits or other unwanted inputs of electrical energy can occur within the device or at the boundary of the system. Such frequently high-energy processes can result in the destruction or damage of the affected device, or adjoining devices or components thereof. The plasma energy protective apparatuses (the energy compensation unit 60, the adapter unit 70 and the interference suppression unit 80) can prevent such damage and reduce the influence of interference upon the ion thruster and a control device of the ion thruster.

Any unavoidable and unwanted input of energy to the power supply unit 19 is controlled and diverted, in a non-destructive manner, by the plasma energy protective apparatuses. To this end, an energy compensation unit 60 is provided in the form of a current and voltage pulse-generating network, which is comprised e.g. of high-voltage diodes and suppressor diodes (such as e.g. transorb diodes) and/or of further passive components, and absorbs a substantial proportion of energy. An adapter unit 70 having two coils (see FIG. 9) ensures a defined current flux, wherein galvanic isolation between the coils is provided, in order to suppress any "common mode" interference.

Figure 8:
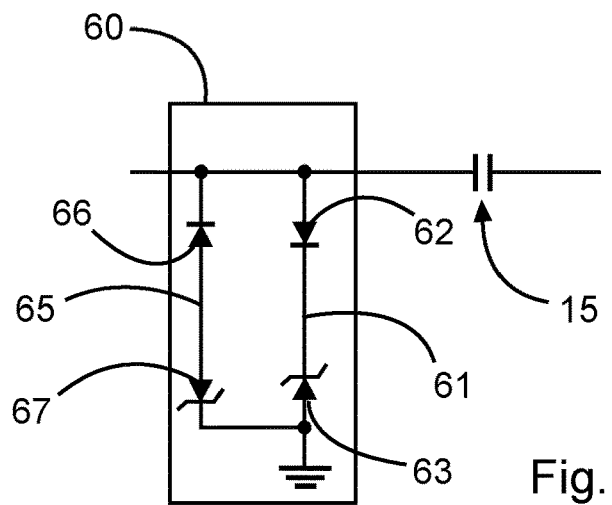
FIG. 8 shows a schematic representation of an energy compensation unit for an ion thruster.

FIG. 8 shows a detailed representation of an exemplary energy compensation unit 60 having two branches 61, 62. Each branch 61, 62 contains a high-voltage diode 62, 66 and a suppressor diode 63, 67. The first high-voltage diode 62 and the first suppressor diode 63, in the first branch 61, are series-connected and mutually inversely connected. The second high-voltage diode 66 and the second suppressor diode 67, in the second branch 65, are series-connected and mutually inversely connected. The two branches 61, 65 are thus also mutually inversely connected, i.e. the first high-voltage diode 62 and the second high-voltage diode 66 are mutually inversely connected, and the first suppressor diode 63 and the second suppressor diode 67 are also mutually inversely connected. In this manner, the energy compensation unit 60 forms a low-capacitance bipolar voltage limiter.

Figure 9:
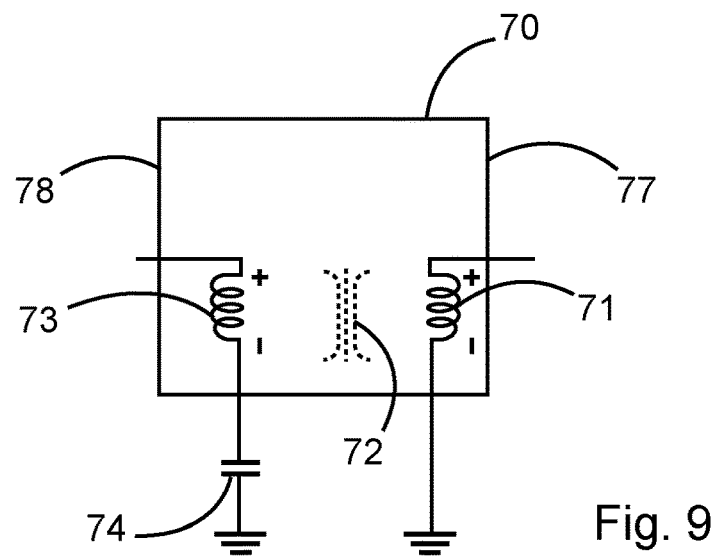
FIG. 9 shows a schematic representation of an adapter unit for an ion thruster.

FIG. 9 shows a detailed representation of an adapter unit 70. The adapter unit 70 comprises a first interface 77 and a second interface 78. The first interface 77 is employed for the formation of an electrical connection to the energy compensation unit 60 or the oscillating circuit 30 of the ion thruster or, in general, for the output of energy to the thruster unit of the ion thruster. The second interface 78 receives energy from the power supply unit.

At the first interface 77, a first coil 71 is arranged and, at the second interface 78, a second coil 73 is arranged which, in the present example, is connected to ground via a capacitor 74 (although the capacitor 74 can also be connected to other components, or to a potential other than ground). Between the coils 71, 73, a core 72 is arranged. The coils 71, 73 and the core 72 form a transformer. The first interface 77 and the second interface 78 are thus galvanically isolated. Alternating current is transmitted via the coils 71, 73.

Figure 10:
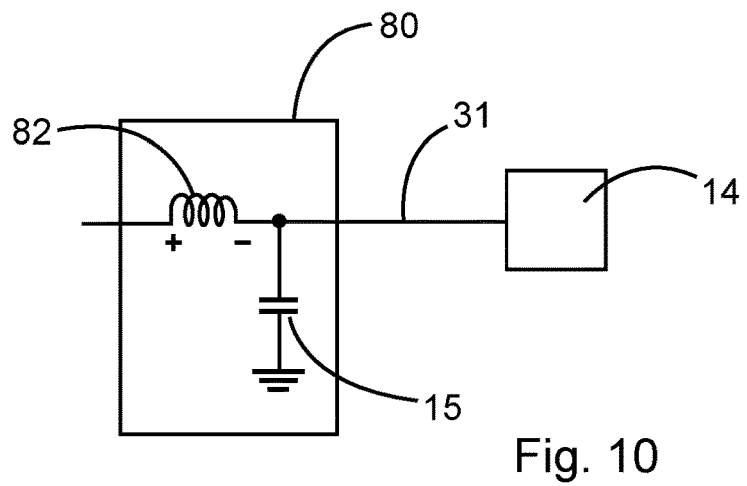
FIG. 10 shows a schematic representation of an interference suppression unit for an ion thruster.

FIG. 10 shows a detailed representation of the interference suppression unit 80, as illustrated above in FIG. 7. The interference suppression unit 80 contains an inductance 82 and the capacitor 15 of the oscillating circuit 30 of the thruster unit of the ion thruster. The inductance 82 and the capacitor 15 form a L-C voltage divider. Energy for the coil 14 of the ion thruster is tapped-off between the inductance 82 and the capacitor 15.

It is understood that the plasma energy protective apparatuses 60, 70, 80 from FIGS. 8 to 10 can each be employed individually, in their own right, or in combination with one of the other two, or with both of the other plasma energy protective apparatuses in an ion thruster. Likewise, one or more (arbitrarily two, or all three) of the plasma energy protective apparatuses 60, 70, 80 can be employed with the control device described with reference to FIGS. 2 to 5.

Additionally, it should be observed that the terms "incorporating" or "comprising" do not exclude any other elements or steps, and that the terms "a" or "an" do not exclude a plural. It should further be observed that features or steps described with reference to one of the above-mentioned exemplary embodiments can also be employed in combination with other features or steps of other above-mentioned exemplary embodiments. Reference numbers included in the claims are not to be considered by way of limitation.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE NUMBERS

10 Ion thruster
11 Propellant line
12 Housing
13 Terminal
14 Coil
15 Capacitance
16 Grid array
17 Thruster unit
18 Neutralization unit
19 Power supply unit
20 Propellant
22 Cathode
24 Electric field
26 Accelerated ions
30 Oscillating circuit
31 Conductor
32 Switch mechanism
34 Voltage supply
36 Load, plasma
50 Frequency generator
60 Energy compensation unit
61 First branch
62 First high-voltage diode
63 First suppressor diode
65 Second branch
66 Second high-voltage diode
67 Second suppressor diode
70 Adapter unit
71 First coil
72 Core
73 Second coil
74 Capacitance
77 First interface
78 Second interface
80 Interference suppression unit
82 Inductance
100 Control device
110 Detection unit
115 Low-pass filter
120 Computing unit
125 Time-delay element
130 Signal characteristic
132 Fundamental wave
134 Harmonic
136 Zero line
140 First signal characteristic, switching signal
150 Second signal characteristic, working signal

The invention claimed is:

1. A control device for a frequency generator, the control device comprising:
 a detection unit; and
 a computing unit;
 wherein the detection unit is configured to detect a voltage characteristic and current characteristic of a frequency generator and to execute a transmission thereof to the computing unit;
 wherein the computing unit is configured to determine a temporal offset ($\Delta t_1$, $\Delta t_2$) between one edge of the current characteristic and an associated edge of the voltage characteristic;
 wherein the computing unit is configured to generate and vary a switching signal for an output of the voltage characteristic, in order to reduce the temporal offset between one edge of the current characteristic and an associated edge of the voltage characteristic;
 wherein the detection unit is configured to detect a time point of a zero-crossing in the voltage characteristic and a time point of a zero-crossing in the current characteristic; and
 wherein the detection unit is configured, further to the detection of a zero-crossing in the voltage characteristic and/or of a zero-crossing in the current characteristic, to suspend any further detection of a zero-crossing in the voltage characteristic and/or of a zero-crossing in the current characteristic for a lock-out time, and only to permit a further detection of a zero-crossing in the voltage characteristic and/or of a zero-crossing in the current characteristic upon the expiry of the lock-out time.

2. The control device as claimed in claim 1,
 wherein the detection unit is configured to permit the resumed detection of a zero-crossing in the voltage characteristic and/or of a zero-crossing in the current characteristic further to the expiry of the lock-out time, for the duration of a detection time; and
 wherein the detection time directly follows the lock-out time and has a duration equal to double a difference between the present cycle time of the voltage characteristic and/or of the current characteristic and a proportion of the lock-out time to which the present cycle time corresponds.

3. The control device as claimed in claim 2,
 wherein the detection unit is configured to transmit a zero-crossing which is detected during the detection time to the computing unit;
 wherein the computing unit is configured, on the basis of the zero-crossing which is detected during the detection time, to redetermine the present cycle time of the current and/or voltage characteristic thus detected; and
 wherein the computing unit is configured, on the basis of the redetermined cycle time for the detected current and/or voltage characteristic, to redefine the lock-out time and the detection time.

4. The control device as claimed in claim 3,
 wherein the redefined lock-out time directly follows the zero-crossing which is detected during the detection time.

5. The control device as claimed in claim 1,
 wherein the detection unit comprises a low-pass filter; and
 wherein the low-pass filter is configured to filter out signal components of the detected current and/or voltage characteristic which exceed a definable frequency threshold value.

6. The control device as claimed in claim 5,
 wherein the detection unit is configured to identify the time point of a zero-crossing in the voltage characteristic and/or the time point of a zero-crossing in the current characteristic, subsequently to the filtering of the current and/or voltage characteristic by the low-pass filter.

7. The control device as claimed in claim 1,
 wherein the control device comprises a time-delay element; and
 wherein the time-delay element is configured to add a delay to the time point of a detected zero-crossing in the voltage characteristic and/or a detected zero-crossing in the current characteristic, before the computing unit determines the temporal offset ($\Delta t_1$, $\Delta t_2$) between one edge of the current characteristic and an associated edge of the voltage characteristic.

8. The control device as claimed in claim 7,
wherein the delay is a phase displacement, which is related to the cycle time of the detected current and/or voltage characteristic.

9. An ion thruster, comprising:
a frequency generator for outputting electrical energy at a definable frequency, in order to generate an electric field; and
a control device as claimed in claim 1;
wherein the control device is coupled to the frequency generator, in order to operate the frequency generator at a specified frequency, such that a propellant is ionized in the electric field.

10. The ion thruster as claimed in claim 9,
wherein the frequency generator comprises an oscillating circuit; and wherein the oscillating circuit is a R-L-C oscillating circuit.

11. The ion thruster as claimed in claim 10,
wherein the frequency generator comprises a semiconductor switch mechanism, which is coupled to the oscillating circuit and is configured to actuate the oscillating circuit in accordance with the switching signal of the control device.

12. An ion thruster, comprising:
a thruster unit; and
a power supply unit having a switch mechanism;
wherein the switch mechanism comprises an energy compensation unit;
wherein the energy compensation unit is arranged in the switch mechanism on an output side, and is configured to at least partially accommodate a power flashover from the thruster unit to the power supply unit; and
wherein the energy compensation unit is configured as a low-capacitance bipolar voltage limiter.

13. The ion thruster as claimed in claim 12,
wherein the energy compensation unit comprises a first branch and a second branch;
wherein the first branch comprises a first high-voltage diode and a first suppressor diode which is series-connected and inversely connected thereto;
wherein the second branch comprises a second high-voltage diode and a second suppressor diode which is series-connected and inversely connected thereto;
wherein the first high-voltage diode is inversely connected to the second high-voltage diode; and
wherein the first suppressor diode is inversely connected to the second suppressor diode.

14. An ion thruster, comprising:
a thruster unit; and
a power supply unit having a switch mechanism;
wherein the switch mechanism comprises an adapter unit;
wherein the adapter unit comprises a first interface and a second interface;
wherein the adapter unit is configured for the take-up of electrical energy from electronic components of the power supply unit via the second interface, and for the output of electrical energy to the thruster unit via the first interface; and
wherein the first interface is galvanically isolated from the second interface.

\* \* \* \* \*